US007948763B2

(12) United States Patent
Chuang

(10) Patent No.: US 7,948,763 B2
(45) Date of Patent: May 24, 2011

(54) MODULE WITH FLEXIBLE PRINTED CIRCUIT

(75) Inventor: Meng Ju Chuang, Hsinchu (TW)

(73) Assignee: Chimei Innolux Corporation, Chu-Nan (TW)

( * ) Notice: Subject to any disclaimer, the term of this patent is extended or adjusted under 35 U.S.C. 154(b) by 0 days.

(21) Appl. No.: 12/430,033

(22) Filed: Apr. 24, 2009

(65) Prior Publication Data

US 2009/0207368 A1    Aug. 20, 2009

Related U.S. Application Data

(62) Division of application No. 10/921,942, filed on Aug. 20, 2004, now abandoned.

(30) Foreign Application Priority Data

Aug. 21, 2003   (TW) .............................. 92122965 A

(51) Int. Cl.
*H05K 1/00*   (2006.01)
(52) U.S. Cl. ......... 361/749; 361/750; 361/789; 174/254
(58) Field of Classification Search .................. None
See application file for complete search history.

(56) References Cited

U.S. PATENT DOCUMENTS

| 5,061,830 A | 10/1991 | Ambrose |
| 5,130,499 A | 7/1992 | Dijkshoom |
| 5,281,765 A | 1/1994 | Iura et al. |
| 5,341,806 A | 8/1994 | Gadsby et al. |
| 5,351,691 A | 10/1994 | Brommersma |
| 6,629,765 B2 | 10/2003 | Toyoda et al. |
| 6,630,625 B1 | 10/2003 | Akashi et al. |
| 6,743,982 B2 | 6/2004 | Biegelsen et al. |

FOREIGN PATENT DOCUMENTS

| JP | 2264222 | 10/1990 |
| JP | 4304427 | 10/1992 |
| JP | 5048218 | 2/1993 |
| JP | 2003204130 | 7/2003 |

*Primary Examiner* — Tuan T Dinh
(74) *Attorney, Agent, or Firm* — Liu & Liu

(57) ABSTRACT

The FPC that is designed to have the special shape, an elastic portion, can shorten its length by elastic force after it is turned over to the reverse side of the light source unit for achieving the purposes without wasting any space of the LCD module and incurring the inconvenience of user.

18 Claims, 5 Drawing Sheets

MODULE WITH FLEXIBLE PRINTED CIRCUIT

This is a Divisional of U.S. patent application Ser. No. 10/921,942, filed Aug. 20, 2004, which is commonly assigned to the assignee of the present invention, and which is incorporated by reference herein as if fully set forth herein.

BACKGROUND OF THE INVENTION

1. Field of the Invention

The invention relates to a module with flexible printed circuit board (FPC), more particularly to a module with FPC that has an elastic portion to avoid wasting the space of module.

2. Description of the Prior Art

With the development of science and technology, the display technology and the monitor play a very important role in the development process of the information technology. The portable devices and the display panel incorporated into each electric apparatus or meter, such as the computer, television, mobile phone, BP, and PDA (Personal Digital Assistant), provided large information in our daily life and work. Especially, the LCD (liquid crystal display), which has many advantages such as low power consumption, low radiation, slim body and better display quality, becomes the main product in the flat panel display market.

As illustrated in FIG. 1, an LCD module 1, which uses the LED (Light Emitting Diode) as the light source, comprises of an LCD panel 10, an LED back light source 20, a light source FPC (flexible printed circuit board) 30, a panel FPC 40, a connector 50 and a PCB (print circuit board) 60. The light source FPC 30 connected with the panel FPC 40 by using the connector 50 and the plug-pull method. However, in consideration of the reliability and the thickness, another method is to connect the light source FPC 30 and the panel FPC 40 by the bonding or soldering process, so as to spare the space for the connector 50. Besides, the circuit on the light source FPC 30 can supply the power to the LED back light source 20, and the circuit on the panel FPC 40 can transmit the signal to control the LCD panel 10. The above back light source 20 uses the LED as the light source. In fact, the light source for the back light source 20 can also be CCFL (Cold Cathode Fluorescent Lamp) or other similar luminous components.

Please refer to FIG. 2, the light source FPC 30 is connected with the panel FPC 40 by the bonding or soldering process. One end of the light source FPC 30 is connected with the back light source 20 and one end of the panel FPC 40 is connected with the LCD panel 10 respectively. The light source FPC 30 and the panel FPC 40 should be first positioned and then exactly connected by bonding or soldering. After connection, the light source FPC 30 and the panel FPC 40 are then turned over to the reverse side of the back light source 20 as illustrated in FIG. 3. However, due to the relative thickness of the LCD panel 10 and the backlight source 20, after the connected light source FPC 30 and the panel FPC 40 are turned over to the reverse side of the backlight source 20, the light source FPC 30 extends from the panel FPC 40 by a length L'. Not only the extra space is needed, but also the difficulty of the design and the inconvenience of the user are increased.

SUMMARY OF THE INVENTION

In light of the state of the art described above, it is an object of the present invention to provide a FPC that can be applied to the LCD module without wasting any space and incurring the inconvenience of user. The FPC is designed to have an elastic portion formed by special shape. Thus, the distance between the two connection ends of the FPC can be restored and shortened by elastic force after it is turned over to the reverse side of the light source unit, and it is easy and cheap to implement this invention.

In view of the above and other objects which will become apparent as the description proceeds, there is provided according to a general aspect of the present invention a flexible printed circuit board (FPC) including an elastic portion. The FPC has a first axial length when no force is applied. When a pulling force is applied to the FPC, the elastic portion is extended along an extending direction such that the FPC has a second axial length longer than the first axial length.

Based on the idea described above, when the pulling force is released, the axial length of the FPC changes from the second axial length into a third axial length shorter than the second axial length due to elastic force.

Based on the aforementioned idea, the elastic portion includes jag, tooth, arc, step or combinations thereof.

Based on the idea described above, the material of said FPC is selected from the group consisting of polymer and polyester.

Based on the aforementioned idea, the FPC comprises signal lines.

Based on the idea described above, the FPC comprises power lines.

In view of the above and other objects which will become apparent as the description proceeds, there is provided according to a general aspect of the present invention a method for manufacturing a module with flexible printed circuit board (FPC). The method comprises providing a first device and a second device on the first device; providing a first flexible printed circuit board (FPC) to connect an edge of the first device, wherein the first FPC includes an elastic portion; providing a second FPC to connect an edge of the second device; connecting the first and second FPCs at a connection end while the elastic portion of the first FPC is extended along an extending direction by a pulling force; and turning over the first and second FPCs and the connection end to a reverse side of the first device while the extended elastic portion of the first FPC is restored or shortened.

Based on the idea described above, the first and second FPCs are connected by bonding or soldering.

In view of the above and other objects which will become apparent as the description proceeds, there is provided according to a general aspect of the present invention a module with flexible printed circuit board (FPC). The module comprises a first device; a second device on said first device; a first flexible printed circuit board (FPC) connected to said first device, wherein the first FPC includes an elastic portion; and a second FPC connected to said second device. The first and second FPCs are connected at a connection end, and the connection end, a part of the first FPC, and a part of the second FPC are positioned under a reverse side of the first device.

Based on the idea described above, the first device can be a light source unit, for example, a backlight unit such as an LED unit.

Based on the aforementioned idea, the second device is a panel, for example, an LCD panel.

In view of the above and other objects which will become apparent as the description proceeds, there is provided according to a general aspect of the present invention an LCD module with flexible printed circuit board (FPC). The LCD module comprises a backlight unit; an LCD panel on the backlight unit; a first FPC connected to the backlight unit, wherein the first FPC includes an elastic portion; and a second FPC connected to the LCD panel. The second FPC includes an elastic portion, wherein the first and second FPCs are connected at a connection end, and the connection end, a part of the first FPC, and a part of the second FPC are positioned under a reverse side of the backlight unit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

The material of FPC is polymer or polyester. Such board has flexibility, and can be curved to a predetermined shape without damaging itself and the circuit thereon. Hence, the basic concept of this invention is to design a special shape of FPC. The FPC includes an elastic portion. When no force is applied, the FPC has a first axial length. When a pulling force is applied to the FPC, the elastic portion is extended along an extending direction such that the FPC has a second axial length longer than the first axial length.

The special-shaped FPC of the present invention can be a light source FPC (that is, an FPC connected to a light source) used in an LCD module.

Figure 1:
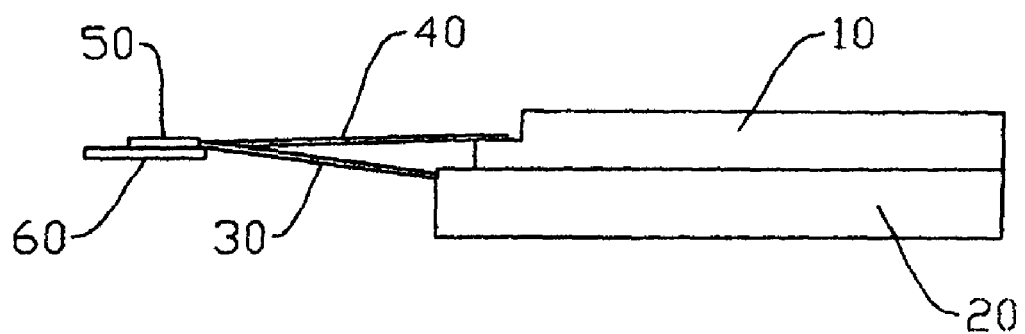
FIG. 1 illustrates a view of conventional LCD module by using a connector to connect the light source FPC and the panel FPC on the PCB.
Figure 2:
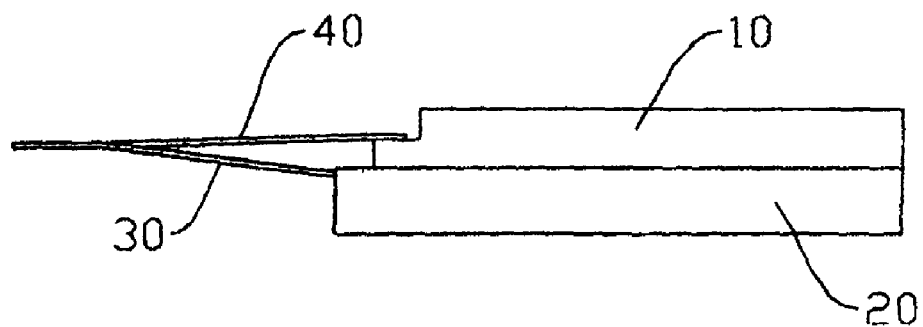
FIG. 2 illustrates a view of conventional LCD module to connect the light source FPC and the panel FPC by the bonding or soldering process before two FPCs are turned over to the reverse side of the backlight source.
Figure 3:
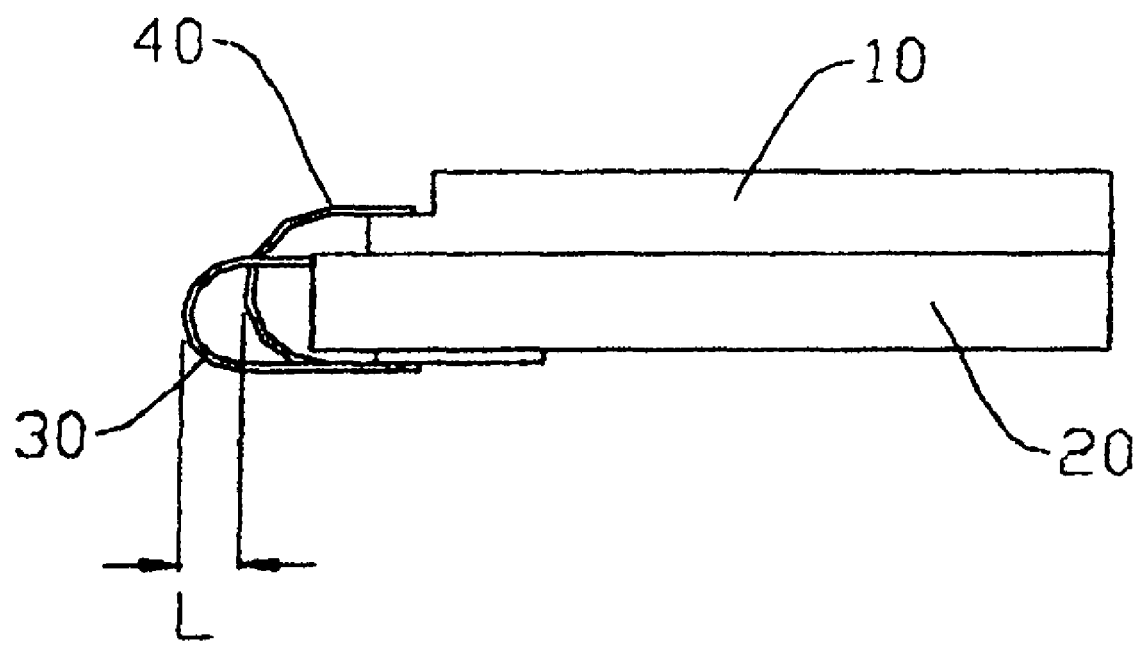
FIG. 3 illustrates a view of conventional LCD module to connect the light source FPC and the panel FPC by the bonding or soldering process after two FPCs are turned over to the reverse side of the backlight source.
Figure 4:
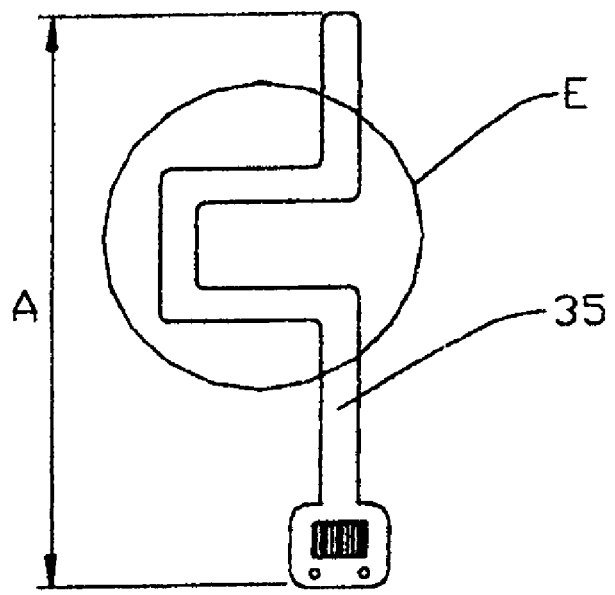
FIG. 4 illustrates a view of the light source FPC according to the first embodiment of this invention, wherein no force is applied on the light source FPC yet.

The first embodiment of this invention is illustrated in FIG. 4. It shows a light source FPC 35, including an elastic portion E. The elastic portion can include jag, tooth, rectangle, step, or combinations thereof. Although only one tooth is shown in FIG. 4, in fact, a plurality of teeth in continuous or non-continuous shape is also available for the present invention.

Figure 5:
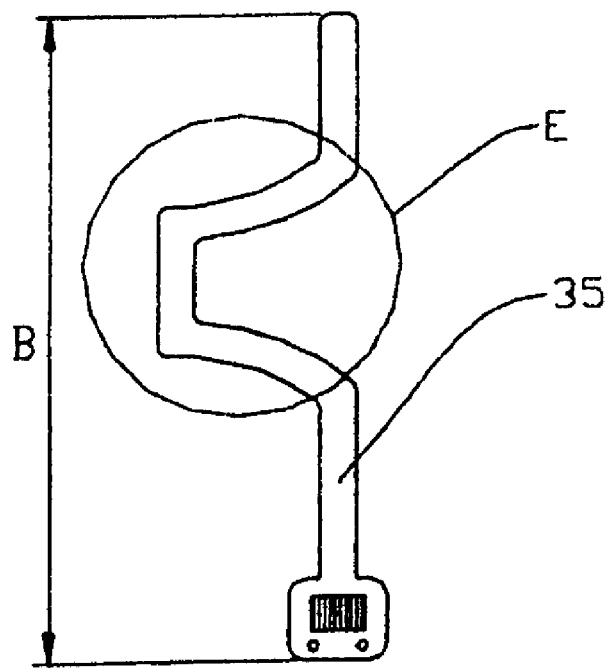
FIG. 5 illustrates a view of the light source FPC according to the first embodiment of this invention, wherein the axial length of the FPC is extended to the predetermined length when a force is applied on the light source FPC.

When no force is applied, the light source FPC 35 has an axial length A, as shown in FIG. 4. Referring to FIG. 5, when a pulling force is applied to the light source FPC 35, the elastic portion E is extended along an extending direction, such that the FPC 35 has an axial length B longer than the axial length A. Such extension will not damage the FPC 35 itself and the circuit thereon.

Figure 6:
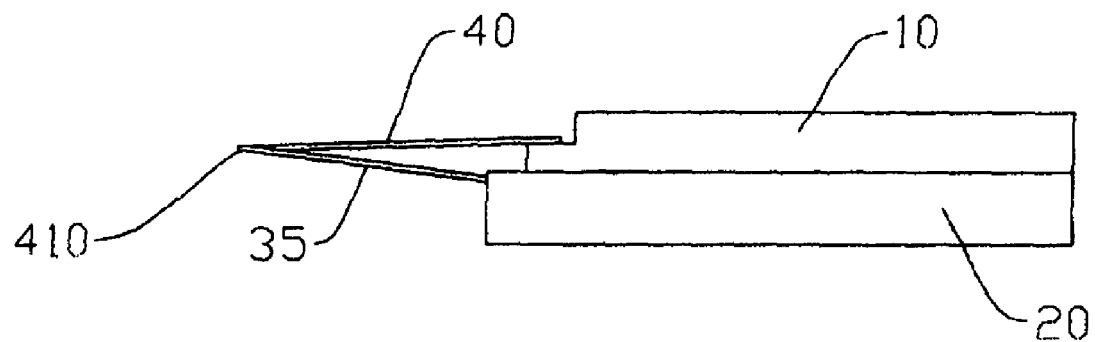
FIG. 6 illustrates a view of LCD module to connect the light source FPC and the panel FPC by the bonding or soldering process before two FPCs are turned over to the reverse side of the backlight unit according to the present invention.
Figure 7:
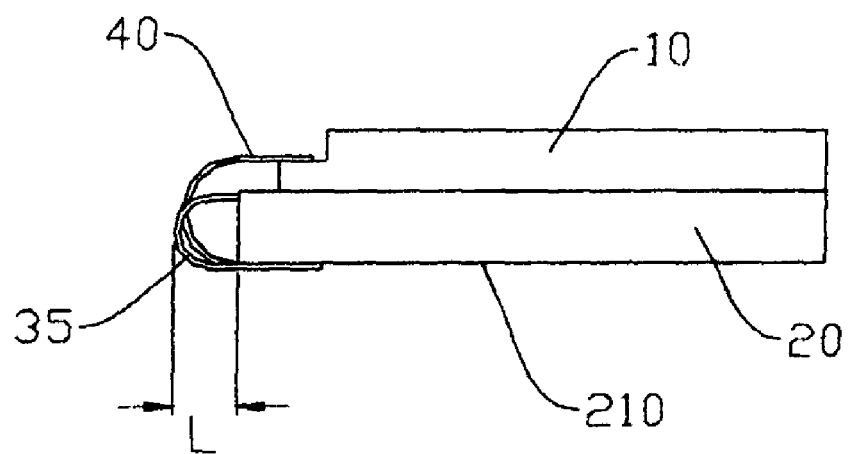
FIG. 7 illustrates a view of LCD module to connect the light source FPC and the panel FPC by the bonding or soldering process after two FPCs are turned over to the reverse side of the backlight unit according to the present invention.

The light source FPC 35 of FIG. 4 can be used in an LCD module. FIG. 6 shows an LCD module including the light source FPC 35 of the present invention. The method for manufacturing the LCD module is described below. First, the light source FPC 35 is connected to an edge of a light source unit (for example, a backlight unit) 20. A panel FPC 40 is connected to an edge of an LCD panel 10.

Then, the light source FPC 35 is extended such that the light source FPC 35 and the panel FPC 40 is connected (for example, by bonding or soldering) at a connection end 411, as shown in FIG. 6. For example, the light source FPC 35 is extended to the axial length B, as shown in FIG. 5. At this time, the elastic portion E is extended.

Then, the light source FPC 35 and the panel FPC 40 are turned over to a reverse side 210 of the light source unit 20, such that the connection end 410 is connected to the reverse side 210. At this time, the extended elastic portion of the light source FPC 35 is restored or shortened due to elastic force, for example, shortened to its original axial length A.

Figure 8:
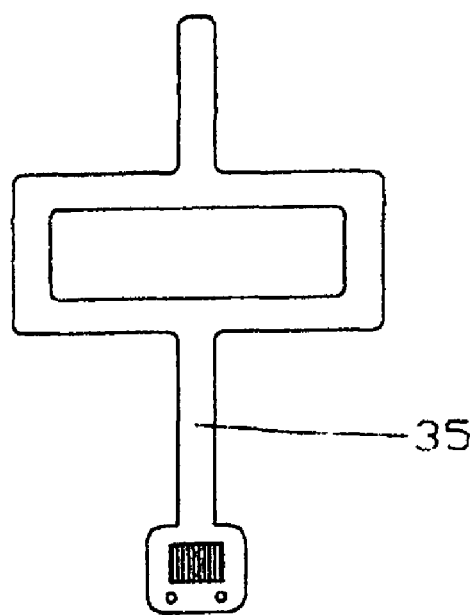
FIG. 8 illustrates a view of the light source FPC according to the second embodiment of this invention, wherein the shape of the FPC comprises a rectangle.
Figure 9:
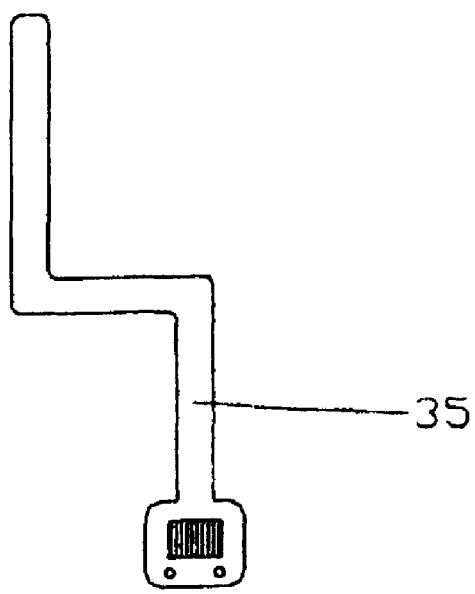
FIG. 9 illustrates a view of the light source FPC according to the third embodiment of this invention, wherein the shape of the FPC comprises a step.

As illustrated in the second (rectangle shape) and third (step shape) embodiments in FIG. 8 and FIG. 9, there is no limitation on the shape of the light source FPC 35 according to this invention. The light source FPC 35 with any geometric shape, which can be flexible in the special direction, belongs in the scope of this invention. Certainly, subject to the actual need, such shape can be designed as several continuous or non-continuous parts or the combination thereof.

In addition, the turned-over the panel FPC may protrude over the light source FPC due to the different designs. In accordance with the above concept, we can design the panel FPC in the shorter length (size A), which can be extended to the predetermined length (size B, size B>size A) without damaging itself and the circuit thereon when it is connected on the light source FPC for bonding or soldering. After the panel FPC is turned over, the length of such board is short than size B due to the elastic force between two ends thereof. Because the two ends thereof are fixed, the extended length of the panel FPC can be reduced, and is roughly equal to the extended length of the light source FPC.

This invention provides a FPC that can be applied to the LCD module without wasting any space and incurring the inconvenience of user. The FPC with the special shape, an elastic portion, can shorten its length by restoring force after it is turned over, and it is easy and cheap to implement this invention. Besides, this invention can not only be applied to the LCD module, but also any product which uses a FPC with the flexible property due to its special shape falls within the claim of this patent.

In conclusion, the present invention provides a special-designed FPC including an elastic portion. The special FPC can be a light source FPC suitable for use in an LCD module. Before the light source FPC is turned over to the reverse side of the light source unit, the light source FPC is extended to connect with a panel FPC. When the light source FPC is turned over to the reverse side of the light source unit, the light source FPC is restored to its original axial length. Thus, the light source FPC does not protrude from the panel FPC, and the space of the LCD module can be saved.

Although the specific embodiments have been illustrated and described, it will be obvious to those skilled in the art that various modifications may be made without departing from what is intended to be limited solely by the appended claims.

What is claimed is:

1. A module with flexible printed circuit board (FPC), comprising:
    a first device;
    a second device on said first device;
    a first FPC extending along a plane and connected to said first device, wherein the first FPC includes an elastic portion comprising a bend structure within the plane and at a location between distal ends of the first FPC when no force is applied; and
    a second FPC connected to said second device,
    wherein the first and second FPCs are connected at an connection end, and
    wherein the connection end, a part of the first FPC, and a part of the second FPC are positioned under a reverse side of the first device, with the first FPC bent into a curved structure by extending and flexing the bend structure by a pulling force applied in an extending direction,
    wherein the first FPC has a first overall length when no force is applied, and wherein when a the pulling force is applied to the first FPC along the extending direction, the bend structure of the elastic portion is flexed to extend along the extending direction such that the first FPC has a second overall length longer than the first overall length.

2. The module with FPC according to claim 1, wherein when the pulling force is released, the axial length of the first FPC changes from the second axial length into a third axial length shorter than the second axial length due to elastic force.

3. The module with FPC according to claim 1, wherein the first FPC comprises signal lines.

4. The module with FPC according to claim 1, wherein the first FPC comprises power lines.

5. The module with FPC according to claim 1, wherein the elastic portion includes jag, tooth, rectangle, step or combinations thereof.

6. The module with FPC according to claim 1, wherein the material of said first and second FPCs are selected from the group consisting of polymer and polyester.

7. The module with FPC according to claim 1, wherein the first device is a light source unit.

8. The module with FPC according to claim 1, wherein the second device is a panel.

9. The module with FPC according to claim 1, wherein the first and second FPCs are connected by bonding or soldering.

10. The module with FPC according to claim 1, wherein the elastic portion flexes within the plane to extend in the extending direction.

11. The module with FPC according to claim 7, wherein the first device is a backlight unit.

12. The module with FPC according to claim 8, wherein the second device is an LCD panel.

13. The module with FPC according to claim 11, wherein the first device is an LED unit.

14. An LCD module with flexible printed circuit board (FPC), comprising:
    a backlight unit;
    an LCD panel on the backlight unit;
    a first FPC extending along a plane and connected to the backlight unit, wherein the first FPC includes an elastic portion comprising a bend structure within the plane and at a location between distal ends of the first FPC when no force is applied; and
    a second FPC connected to the LCD panel,
    wherein the first and second FPCs are connected at an connection end, and
    wherein the connection end, a part of the first FPC, and a part of the second FPC are positioned under a reverse side of the backlight unit, with the first FPC bent into a curved structure by extending and flexing the bend structure by a pulling force applied in an extending direction,
    wherein the first FPC has a first overall length when no force is applied, and wherein when a the pulling force is applied to the first FPC along the extending direction, the bend structure of the elastic portion is flexed to extend along the extending direction such that the first FPC has a second overall length longer than the first overall length.

15. The LCD module with FPC according to claim 14, wherein the material of said first FPC is selected from the group consisting of polymer and polyester.

16. The LCD module with FPC according to claim 14, wherein of the elastic portion flexes within the plane to extend in the extending direction.

17. The LCD module with FPC according to claim 14, wherein when the pulling force is released, the axial length of the first FPC changes from the second axial length into a third axial length shorter than the second axial length due to elastic force.

18. The LCD module with FPC according to claim 14, wherein the first FPC comprises signal lines or power lines.

* * * * *